United States Patent [19]

Pak

[11] Patent Number: 4,702,365

[45] Date of Patent: Oct. 27, 1987

[54] APPARATUS FOR REMOVING INDIVIDUAL WAFER SEGMENTS FROM A FRAMED CARRIER

[76] Inventor: Chong-Il Pak, 3610 Bassett St., #5, Santa Clara, Calif. 95050

[21] Appl. No.: 896,655

[22] Filed: Aug. 13, 1986

Related U.S. Application Data

[63] Continuation-in-part of Ser. No. 649,080, Sep. 10, 1984, Pat. No. 4,607,744.

[51] Int. Cl.$^4$ ............................................. B65G 47/31
[52] U.S. Cl. .................................... 198/461; 198/750; 206/328; 221/74; 242/74.2
[58] Field of Search ................ 198/461, 750; 414/403, 414/416; 221/71, 74; 29/759, 849; 206/328, 330; 242/74, 74.1, 74.2

[56] References Cited

U.S. PATENT DOCUMENTS

| | | | |
|---|---|---|---|
| 1,160,792 | 11/1915 | Van Houten | 198/461 |
| 1,672,522 | 6/1928 | Greer et al. | 198/465.1 |
| 2,059,242 | 11/1936 | Jung | 242/74.2 |
| 2,503,771 | 4/1950 | Roll | 198/750 X |
| 2,542,330 | 2/1951 | Henderson et al. | 198/461 X |
| 3,187,873 | 6/1965 | Wolff | 198/461 |
| 3,562,057 | 2/1971 | McAlister et al. | 206/328 X |
| 3,606,035 | 9/1971 | Gantley | 414/28 |
| 4,089,725 | 5/1978 | Crankshaw et al. | 221/74 |
| 4,095,926 | 6/1978 | Paul | 198/457 X |
| 4,235,328 | 11/1980 | Marshall | 198/465.1 X |

FOREIGN PATENT DOCUMENTS 208140 10/1966 Sweden ................................. 414/416

Primary Examiner—Robert J. Spar
Assistant Examiner—Jonathan D. Holmes

[57] ABSTRACT

An apparatus for removing segments of a wafer adhering to an upper surface of a flat flexible carrier. The apparatus comprises a base supporting a separator plate disposed between a cassette-type conveyor and a support plate. The separator plate has a separator edge spaced apart from the conveyor to form a narrow gap. A take-up drum is rotatably mounted within the base and has a clamping member capable of gripping the leading edge of the flexible carrier. When the take-up drum is rotated by a powering mechanism the carrier is drawn along the support surface and into the narrow gap between the separator plate and conveyor. The carrier is framed to ensure that the carrier maintains its configuration during operation of the apparatus. The powering mechanism that rotates the take-up drum simultaneously actuates the conveyor. Thus, as the carrier is drawn into the narrow gap the segments of the wafer and the frame are peeled from the carrier and deposited onto the conveyor. Guides on the conveyor lift the frame to prevent contact of the frame with the wafer segments. The separator plate and support plate are at a descending angle of 4° as measured from the edge of the conveyor adjacent the narrow gap.

17 Claims, 6 Drawing Figures

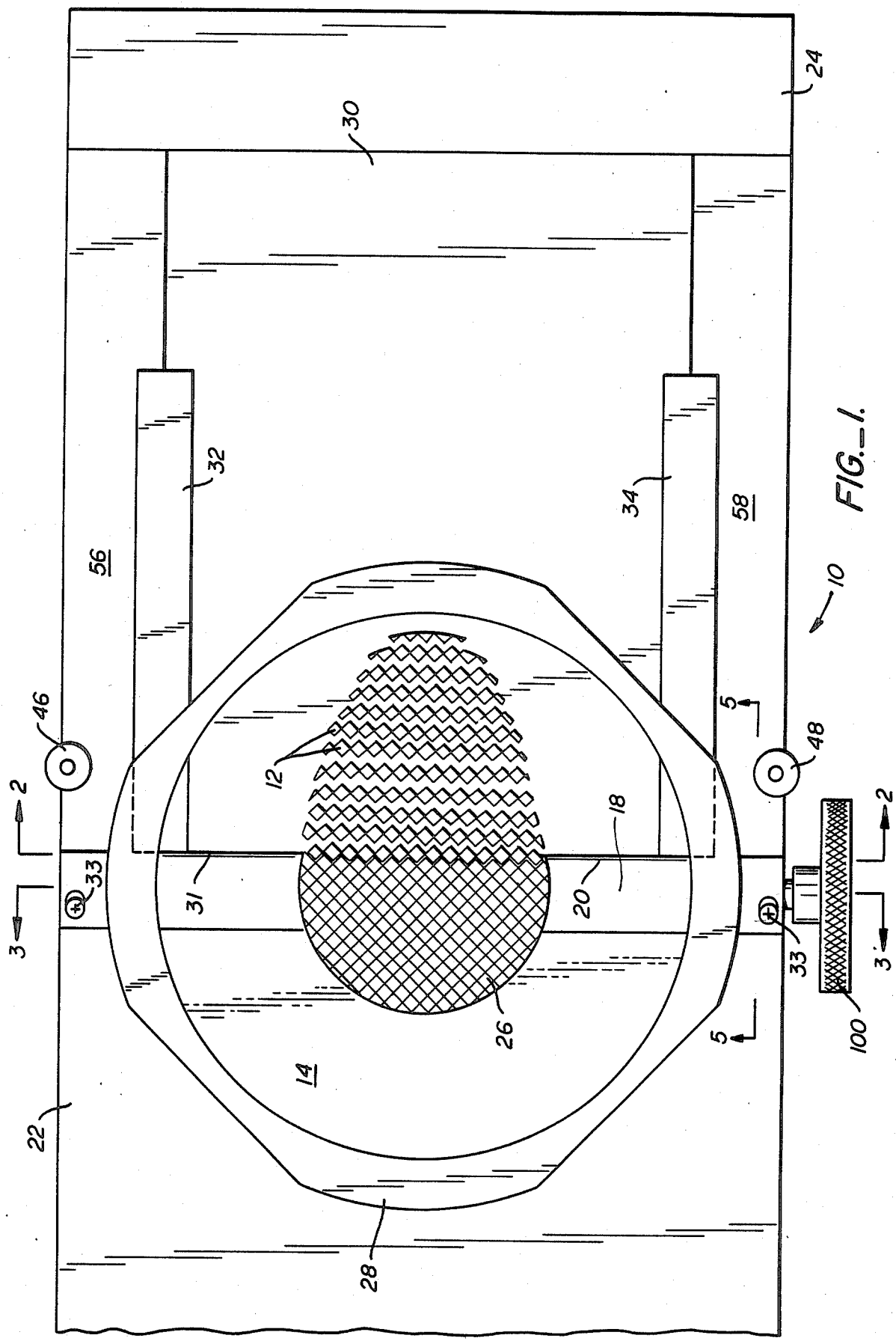

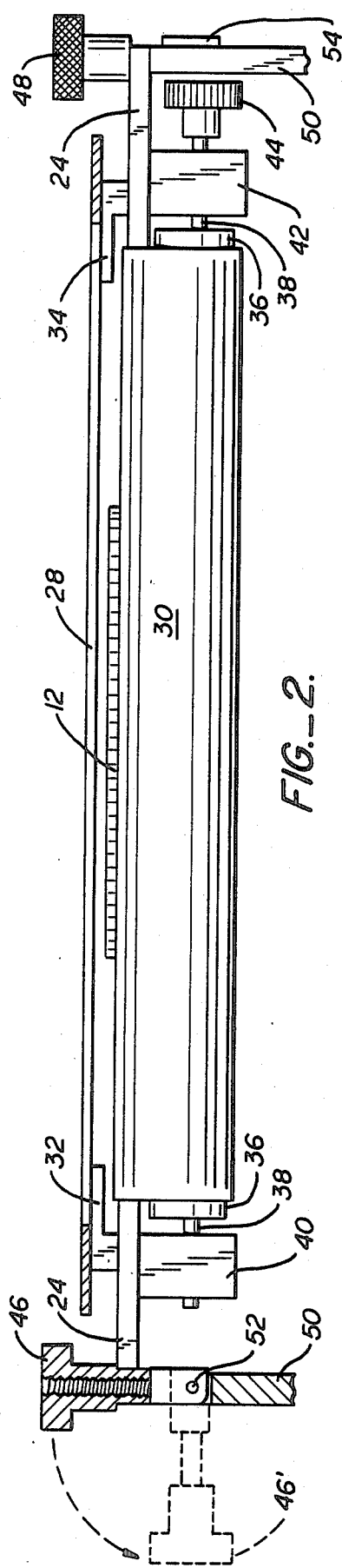
FIG._2.
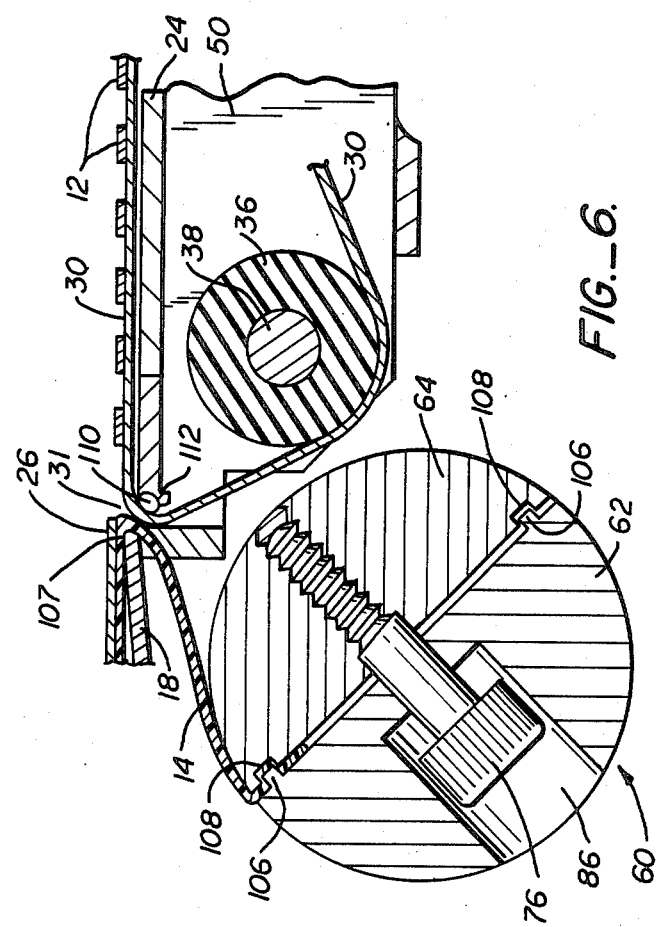
FIG._6.
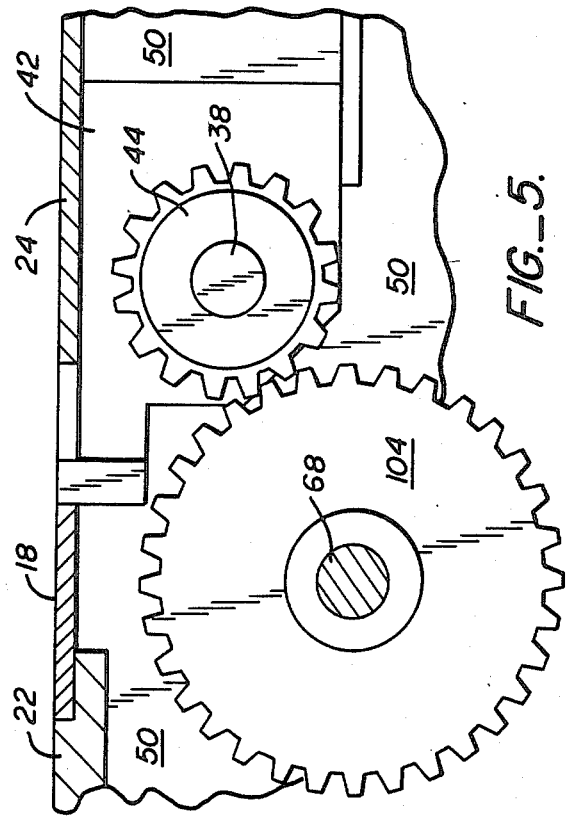
FIG._5.

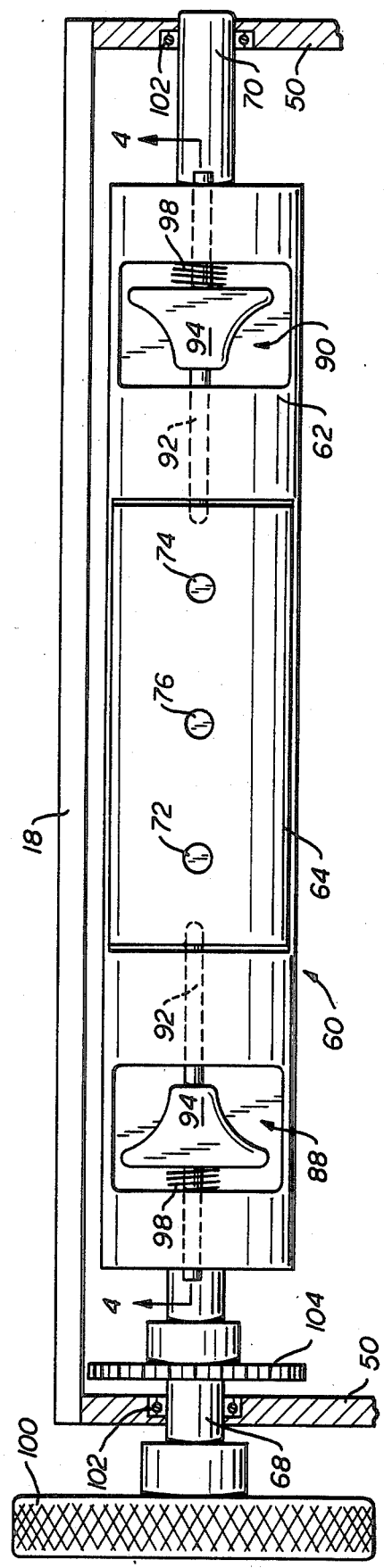
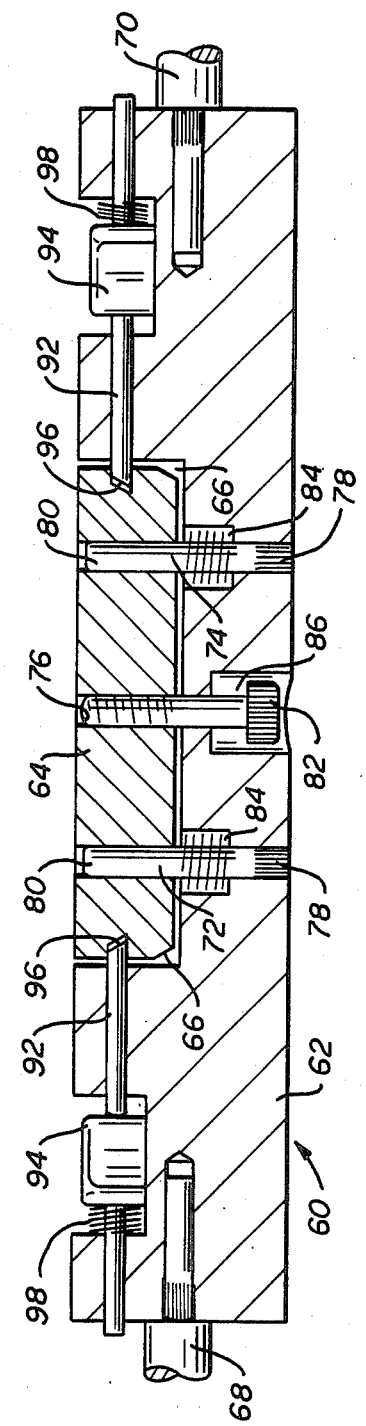
FIG.—3.
FIG.—4.

APPARATUS FOR REMOVING INDIVIDUAL WAFER SEGMENTS FROM A FRAMED CARRIER

CROSS REFERENCE TO RELATED APPLICATION

This application is a continuation-in-part of application Ser. No. 649,080, filed Sept. 10, 1984, now U.S. Pat. No. 4,607,744.

TECHNICAL FIELD

The invention relates generally to machines used in the processing of integrated circuit chips, and in particular to devices for removing integrated circuit chips from a flexible carrier substrate.

BACKGROUND ART

Integrated circuit chips are small sections of semiconductive material (such as silicon) upon which many active and/or passive electronic components have been formed. The manufacture of an integrated circuit chip includes steps of processing a semiconductor wafer to provide multiples of the desired chip, and then cutting the wafer into individual integrated circuit chips arranged in rows and columns.

Before the wafer is cut, it is adhesively attached to a flexible carrier to prevent the dispersal of the chips during the cutting process. A problem encountered in the prior art is how to efficiently remove the individual chips from the flexible carrier without damaging the chips. U.S. Pat. Nos. 3,606,035 to Gantley and 3,562,057 to Mc Alister et al. stretch the carrier, after which the individual chips are removed by tweezers or a vacuum probe. This method is not only time consuming and labor intensive, but the manual handling results in the damage of chips.

An object of the present invention is to provide an apparatus for removing segments of a wafer from a flexible carrier. Another object is to provide such an apparatus which can feed a number of inspectors.

DISCLOSURE OF THE INVENTION

The above objects have been met by an apparatus which peels the flexible, adhesive carrier away from the wafer while simultaneously elongating the wafer configuration. The apparatus has a base having a flat support surface attached atop one end portion of the base and having a flat transport surface atop the opposite end portion.

The transport surface is part of a conveyor and is spaced apart from the support surface by a separator plate. A take-up drum within the base is rotatably coupled to the base and is adapted to grasp the leading edge of the flexible carrier. When the take-up drum is rotated by a powering mechanism, the carrier is drawn along the support surface, past an edge of the separator plate, and into a narrow gap between the separator plate and transport surface. The carrier is framed in order to ensure that the carrier maintains its configuration during operation of the apparatus, but as the carrier is drawn into the narrow gap the frame is separated from the carrier. Guides extending in the direction of frame travel prevent the frame from contacting the transport surface.

The powering mechanism which rotates the take-up drum simultaneously actuates the conveyor. The transport surface of the conveyor is caused to move at a greater speed than the carrier so that the rows of segments of the wafer are separated from each other as they are systematically peeled from the carrier and deposited onto the transport surface at some predetermined angle.

The conveyor is preferably part of a cassette so that a single device can feed a number of inspectors or platers. Thus, the segments of the wafer reach the inspection procedure without having been touched by either man or machine but, instead, by only the surface on which the segments lie.

The separator plate is at approximately a 4° angle relative to the transport surface, so that as the segments of the wafer are peeled from the carrier the leading edge of the transport surface does not interfere with the wafer. The 4° angle is critical since the transport surface is tensioned so as to allow a degree of cushion to the wafer segments.

BRIEF DESCRIPTION OF THE DRAWINGS

FIG. 1 is a partial elevational view of an apparatus in accordance with the present invention.

FIG. 2 is a cross sectional view of the apparatus of FIG. 1 taken along lines 2—2.

FIG. 3 is a cross sectional view of the apparatus of FIG. 1 taken along lines 3—3.

FIG. 4 is a cross sectional view of the take-up drum of FIG. 3 taken along lines 4—4.

FIG. 5 is a cross sectional view of the apparatus of FIG. 1 taken along lines 5—5.

FIG. 6 is a cross sectional view of the apparatus of FIG. 1 in operation.

BEST MODE FOR CARRYING OUT THE INVENTION

With reference to FIG. 1, an apparatus 10 for removing integrated circuit chips 12 from a flexible carrier 14 includes a separator plate 18 having a separator edge 20 between a support surface 22 and a conveyor 24.

The flexible carrier 14 is an adhesive material such as Mylar tape. A wafer 26 is placed upon the carrier so that as the wafer is cut into individual integrated circuit chips 12 the wafer maintains its configuration. The carrier is sufficiently large that it may be adhesively secured to a frame 28. The frame facilitates handling and prevents the carrier from folding or wrinkling when the integrated circuit chips are peeled from the carrier.

The conveyor 24 has a flat transport surface 30. The transport surface is an endless belt and is preferably made from a thin band of stainless steel. It is important that the transport surface be both thin and strong, since the leading edge of the surface must be located very close to separator edge 20, thereby preventing the small integrated circuit chips from falling into the gap 31 between the transport surface and the separator edge. This gap may be varied by the positioning of screws 33 within the slots of separator plate 18.

Guides 32, 34 are positioned on the sides of the transport surface 30. The guides lift the frame 28 above the transport surface. In this manner, the individual chips 12 travel along the transport surface without interference from the frame. Additionally, because the guides eliminate contact of the frame with the transport surface the frame will not scratch or contaminate the transport surface.

The conveyor 24 is a cassette assembly. Referring to FIG. 2, the transport surface 30 is trained about a drive cylinder 36. The drive cylinder which is preferably made from a high friction material such as hard synthetic rubber, is mounted on a shaft 38 for rotation. The shaft engages bearings provided in the elongated support blocks 40, 42 which are attached to the underside of the conveyor 24. Drive gear 44 is fixed to one end of the shaft 38. The transport surface 30 is trained, in like manner, about an idler cylinder (not shown) at the end of the conveyor opposite the separator plate 18.

Knurled release knobs 46, 48 lock the conveyor 24 into the apparatus. The release knobs are pivotably fixed to a base 50 onto which the conveyor, the separator plate 18 and the support plate 22 are positioned. The release knobs are fixed to the base at pivot points 52, 54. With reference to FIGS. 1 and 2, when the release knobs 46, 48 are in a vertical position, the knobs will fit into notches in the conveyor plates 56, 58 outside guides 32, 34. Thus, the cassette-type conveyor cannot be retracted from the apparatus. However, with the release knobs in a horizontal position, as seen in position 46', the conveyor may be taken from the conveyor so that the separated integrated circuit chips 12 may be inspected elsewhere.

Referring now to FIGS. 3 and 4, a take-up drum 60 is rotatably mounted within the base 50 in the vicinity below the separator plate 18. It is the take-up drum which grasps the flexible carrier and separates the carrier from the wafer by drawing the carrier through the gap 31 between the transport surface and the separator plate.

The take-up drum 60 includes a substantially cylindrical member 62 and a clamping member 64 located within a recess 66 of the cylindrical member 62. The cylindrical member is supported for rotation about its longitudinal axis by a pair of shafts 68, 70.

Clamping member 64 is semi-cylindrical in shape and is attached to the cylindrical member 62 by a pair of guide posts 72, 74 and a bolt 76. First ends 78 of the guide posts 72, 74 are pressed into bores provided in the cylindrical member 62 and second ends 80 are loosely disposed within bores of the clamping member 64. A pair of compression springs 84 are disposed around midlength portions of the guide posts 72, 74 within the cylindrical member to provide a biasing force on the clamping member 64 in the direction away from the cylindrical member. The ability of a head 82 of the bolt 76 to move within the bore 86 of the cylindrical member determines to what distance the clamping member is able to move away from the cylindrical member.

A pair of detent mechanisms 88, 90, are provided to hold the clamping member 64 in a clamping position. Each detent mechanism includes a slidable shaft 92 having a tip adapted to engage a recess 96 of the clamping member. A slide 94 is attached to a midlength portion of the slidable shaft 92, and a compression spring 98 is disposed about the slidable shaft between the slide and the cylindrical member 62 to bias the slidable shaft toward the clamping member.

When the slide 94 is moved against the spring pressure, the slidable shaft 92 disengages from the clamping member recess 96 and the clamping member 64 moves away from the cylindrical member 62 to the extent that the bolt head 82 allows. The leading edge of a carrier may then be placed between the members 62, 64 and, when the clamping member is again brought against the cylindrical member, the carrier will be held by frictional engagement within the take-up drum 60.

A take-up knob 100 is attached to an end of the shaft 68. The shafts 68, 70 are rotatably coupled to base 50 by bearings 102 such that the take-up drum 60 is free to rotate. Rotation of the take-up drum in frictional engagement with a carrier will cause the carrier to be drawn around the take-up drum.

A spur gear 104 is fixed to shaft 68 so that rotation of the knob 100 will cause the spur gear to rotate. As can be seen in FIG. 5, the teeth of the spur gear 104 mesh with the teeth of the drive gear 44 which propels the transport surface of the conveyor 24. Thus, rotation of the take-up knob 100 simultaneously causes rotation of the take-up drum 60 and movement of the transport surface 30. However, due to the difference in size between the spur gear 104 and the drive gear 44, the transport surface moves in a linear direction more quickly than the carrier 14 is wrapped around the take up drum.

FIGS. 1 and 6 show the apparatus in operation. The leading edge of a carrier 14 is gripped between the clamping member 64 and the cylindrical member 62 of the take up drum 60. Projections 106 extend into grooves 108, thereby increasing the frictional engagement of the carrier 14 by the take up drum 60.

Take-up drum 60 is caused to rotate in a counterclockwise direction by the couterclockwise rotation of the knob 100. Such rotation will set the transport surface 30 in motion since drive cylinder 36 will rotate in a clockwise direction due to the intermeshing of the gears 44 and 104. Thus, movement of the knob 100 causes the carrier 14 to wrap around a portion of the circumference of the take-up drum 60, drawing the flexible carrier into gap 31. As the flexible carrier moves past the separator plate 18, the individual chips 12 are removed from the carrier and are deposited on the transport surface 30 at some predetermined angle. The separator plate 18 has an undercut portion 107 beneath the separator edge 20 so that as the carrier is bent around the separator plate the pressure exerted on the underside of the carrier is localized along the separator edge.

The support plate 22 and separator plate 18 are at an angle of approximately 4° relative to the conveyor 24. This permits the individual chips 12 to be deposited onto the transport surface 30 without the chips abutting the transport surface. The drive cylinder 36 provides the tension to the transport surface and, as a result, that portion of the transport surface just beyond the drive cylinder is a low tension area. A one-quarter inch diameter rod 110 disposed within a recess 112 at the edge of the conveyor minimizes the friction of the transport surface against the conveyor. Because the transport surface is slightly oversized the transport surface is spaced apart from the conveyor after passing the rod 110. In this manner the chips are provided with a small amount of cushion as they are deposited directly onto the transport surface. The 4° angle places the separator edge above the edge of the conveyor, thereby preventing the chips from abutting the transport surface.

Due to the difference in the speed of take-up drum rotation and transport surface movement the configuration of the wafer 26 is elongated as the individual chips 12 are deposited onto the transport surface. This permits the rows of chips to be spaced apart for easier pickup and handling. The frame 28 prevents the flexible carrier from folding or wrinkling as the take up drum pulls the carrier into the gap 31. The frame is typically made of a metal and will not follow the carrier into the gap. Instead, the frame passes along guides 32, 34 so that the frame will not interfere with the individual chips and will not scratch the transport surface.

After the chips of a particular wafer have been separated, the frame is removed from the guides. The conveyor may also be removed and carried to an inspection or plating station so that an empty conveyor may take the place of the first conveyor. A single apparatus may be used to feed several inspectors or platers.

Although the invention has been described in terms of separating integrated circuit chips from a wafer, it is contemplated that the invention may be used to segmentize any type of wafer. The invention, as described is capable of handling wafers having a diameter of seven inches and a thickness of at least 0.005 inches. However, the apparatus may be adapted to handle larger wafers. Additionally, the take-up knob 100 may foreseeably be replaced by a motor means to rotate the take-up drum and drive cylinder. Finally, while the frame 28 has been illustrated as a ring there is nothing that prevents the frame from having some other configuration.

I claim:

1. An apparatus for removing segments of a wafer adhering to an upper surface of a flat flexible carrier, comprising, base means, a flat support surface coupled to said base means, said support surface having a first end and a second end, continuous conveyor means coupled to said base means, said conveyor means having a flat transport surface, said transport surface having a first and a second edge and being adapted to move in a direction from said first edge to said second edge, a separator member coupled to said base means proximate said second end of said support surface, said separator member having a separator edge at an upper surface thereof which is substantially coplanar with said support surface, said separator edge spaced apart from said first edge of the transport surface to form a narrow gap, said separator member disposed at a descending angle as measured from said transport, surface, frame means for framing said wafer adhereing to said carrier, and a take-up means coupled to said base means, said take-up means being adapted to grip said carrier and to exert a force on said carrier to pull the carrier through said narrow gap such that a lower surface of said carrier engages said separator edge, thereby peeling said segments of the wafer and said frame means from said carrier.

2. The apparatus of claim 1 wherein said conveyor means includes a pair of guides extending from said narrow gap in a direction parallel to the direction of movement of said flat transport surface, said guides disposed to lift said peeled frame means.

3. The apparatus of claim 1 wherein said conveyor means is a cassette-type member, said base means having a means for releaseably locking said cassette-type member to said base means.

4. The apparatus of claim 1 wherein said descending angle of said separator member relative to said transport surface is in a range of 3.5° to 5.5°.

5. The apparatus of claim 1 wherein said frame means is an annular ring adhesively secured to said carrier.

6. The apparatus of claim 1 wherein said separation member is a flat, rectangular plate having said separator edge along a longitudinal side thereof and having an undercut portion beneath said separator edge, whereby said carrier is bent around said longitudinal side such that pressure exerted on said underside of said carrier is localized along said separation edge.

7. The apparatus of claim 1 further comprising drive means coupled to said conveyor means and said take-up means, said drive means causing said transport surface of said conveyor means to have a higher linear velocity than the linear velocity of said carrier.

8. The apparatus of claim 1 wherein said take-up means includes a take-up drum rotatably supported below and proximate to said separation edge, said take-up drum being provided with means for gripping a leading edge of said flexible carrier.

9. The apparatus of claim 8 wherein said take-up drum includes a cylindrical member and a clamping member disposed within a recess formed in said cylindrical member, said clamping member being radially movable between a clamping position and a non-clamping position.

10. The apparatus of claim 1 wherein said conveyor means includes a recess traversing said conveyor means proximate said first edge of said transport surface, said recess containing a cylindrical rod.

11. An apparatus for separating the segments of a divided wafer comprising, base means, a flat support surface mounted atop a portion of said base means, said support surface having a first end and a second end, a separator plate mounted atop said base means adjacent said second end of the support surface, conveyor means attached to said base means, said conveyor means having a rotatable endless belt, said endless belt providing a flat transport surface having a first and a second edge, said first edge spaced apart from said separator plate to form a narrow gap, said separator plate and said support surface disposed at a descending angle relative to said transport surface, a flexible carrier, said divided wafer adhesively secured to said flexible carrier, frame means for framing said wafer adhering to said carrier, take-up means rotatably mounted within said base means, said take-up means being adapted to grip said carrier, and drive means coupled to said conveyor means and said take-up means, said drive means simultaneously rotating said take-up means at a first velocity and moving said transport surface in a direction from said first edge to said second edge at a second velocity greater than said first velocity, said rotation of the take-up means exerting a force on said carrier to pull the carrier through said narrow gap.

12. The apparatus of claim 11 having a means for adjusting said narrow gap formed between the separation plate and the first edge of said transport surface.

13. The apparatus of claim 11 wherein said frame means is an annular ring adhesively secured to said carrier.

14. The apparatus of claim 11 wherein said conveyor means has a pair of guides extending from said narrow gap in a direction parallel to the direction of movement of said transport surface, said guides spaced apart by a distance less than the dimensions of said frame means, thereby lifting said frame means above said transport surface.

15. The apparatus of claim 11 wherein said conveyor means is a cassette-type member.

16. The apparatus of claim 11 wherein said separator member is at a descending angle of between 3.5° and 5.5° relative to said transport surface.

17. The apparatus of claim 11 wherein said conveyor means includes a recess, said recess having a rod traversing said conveyor means adjacent said narrow gap.

* * * * *